United States Patent [19]

Freiheit-Jensen et al.

[11] Patent Number: 5,408,236
[45] Date of Patent: Apr. 18, 1995

[54] HIGH-VOLTAGE UNIT COMPRISING A MEASURING DIVIDER/RESISTOR ARRANGEMENT

[75] Inventors: Bernd Freiheit-Jensen, Hamburg; Arne Lunding, Norderstedt; Hans Negle, Nahe, all of Germany

[73] Assignee: U.S. Philips Corporation, New York, N.Y.

[21] Appl. No.: 45,843

[22] Filed: Apr. 9, 1993

[30] Foreign Application Priority Data

Apr. 9, 1992 [DE] Germany .......... 42 11 944.8

[51] Int. Cl.⁶ .......................................... G01R 31/00
[52] U.S. Cl. .................................... 324/72.5; 324/713
[58] Field of Search ............. 324/72, 72.5, 76.11, 324/120, 713

[56] References Cited

U.S. PATENT DOCUMENTS

| | | | |
|---|---|---|---|
| 3,449,668 | 6/1969 | Blackwell et al. | 324/72 |
| 4,189,673 | 2/1980 | Shintaku | 324/72.5 X |
| 4,418,314 | 11/1983 | Nieto | 324/72.5 |
| 4,950,978 | 8/1990 | Govaert | 324/72 |
| 5,028,863 | 7/1991 | Negle | 324/72 |
| 5,105,181 | 4/1992 | Ross | 324/72.5 X |
| 5,107,201 | 4/1992 | Ogle | 324/72.5 |
| 5,134,364 | 7/1992 | Karpman et al. | 324/72.5 X |
| 5,256,979 | 10/1993 | Moorman | 324/713 |

FOREIGN PATENT DOCUMENTS

| | | | |
|---|---|---|---|
| 118147 | 2/1984 | European Pat. Off. | G01R 1/20 |
| 3714945 | 11/1987 | Germany | G01R 15/02 |

*Primary Examiner*—Kenneth A. Wieder
*Assistant Examiner*—Glenn W. Brown
*Attorney, Agent, or Firm*—Bernard Franzblau

[57] ABSTRACT

A high-voltage unit comprising at least a high-voltage electrode which carries a high voltage in the operating condition of the high-voltage unit. A measuring divider/resistor arrangement is connected between the high-voltage electrode and a measuring point wherefrom a measuring voltage is derived corresponding to the variation in time of the high voltage. A reduced volume and thus a more compact device is achieved in that a flat measuring electrode is provided which carries the potential of the measuring point and in that the measuring divider/resistor arrangement is positioned between the high-voltage electrode and the measuring electrode so that it is inclined relative to each of these electrodes.

20 Claims, 2 Drawing Sheets

HIGH-VOLTAGE UNIT COMPRISING A MEASURING DIVIDER/RESISTOR ARRANGEMENT

BACKGROUND OF THE INVENTION

This invention relates to a high-voltage unit comprising at least a high-voltage electrode which carries a high voltage in the operating condition and a measuring divider/resistor arrangement which is connected between the high-voltage electrode and a measuring point wherefrom a measuring voltage corresponding to the variation in time of the high voltage can be derived.

Such a high-voltage unit in the form of a high-voltage generator for an X-ray generator is known from EP-OS 118 147. The measuring divider/resistor arrangement thereof forms a part of a high-voltage measuring divider which comprises a terminal resistor in addition to the measuring divider/resistor arrangement. A tapping of this high-voltage divider forms the measuring point and the voltage derived from this measuring point, amounting to a few volts, should be proportional as close as possible to the high voltage in a frequency range of from zero to some hundreds of kHz. The measuring divider/resistor arrangement is enclosed by a damping resistor connected to the high voltage. Comparatively high parasitic capacitances then occur. In order to prevent errors in the measuring voltage because of these parasitic capacitances, capacitors are connected parallel to the series-connected resistors constituting the measuring divider/resistor arrangement. These capacitors, which must be constructed so as to be able to withstand a part of the high voltage that depends on the number of resistors in the measuring resistor arrangement, are expensive and susceptible to high-voltage interference.

Furthermore, from DE-PS 37 14 945 there is known a capacitive-resistive voltage divider for measuring high voltages in intermediate-frequency and high-frequency X-ray generators, which divider comprises two mutually parallel high-voltage electrodes which are to be connected to the high voltage to be measured and wherebetween there is arranged a flat measuring electrode which extends parallel thereto. Between the measuring electrode and one of the high-voltage electrodes there is connected a measuring divider/resistor arrangement which consists of an inductance-free, meander-shaped resistor and which extends at an angle relative to the electrodes. When a voltage divider of this kind is built into a high-voltage generator, adequate clearance should exist between the external high-voltage electrodes and the grounded parts within the high-voltage generator, for example, the metal housing of the high-voltage generator, in order to prevent flash-overs. As a result, a comparatively large space is required for such an arrangement. Moreover, high electric field strengths occur at the edges of the high-voltage electrodes.

SUMMARY OF THE INVENTION

It is an object of the present invention to construct a high-voltage unit of the kind set forth such that a compact construction is obtained and that accurate measurement of the high voltage is possible in a wide frequency range.

This object is achieved in accordance with the invention in that there is provided a flat measuring electrode which carries the potential of the measuring point, the measuring divider/resistor arrangement being arranged between the high-voltage electrode and the measuring electrode so as to be inclined relative to these electrodes.

Thus, in accordance with the invention, a high-voltage electrode already present in the high-voltage unit forms a part of the high-voltage measuring divider. This dual function of the high-voltage electrode reduces the costs and, moreover, the use of this electrode for the measuring divider does not require an additional construction volume. Because the measuring electrode potential deviates only slightly from ground potential, at least at the area of the measuring electrodes, no additional insulation parts are required, so that the construction volume is reduced further.

The high-voltage unit may be, for example, a high-voltage generator, a high-voltage user, a high-voltage switch or a high-voltage connector connected to a cable for invasive high-voltage measurements.

For the high-voltage electrode, use can be made of any high-voltage electrode in the high-voltage unit, as long as it has an elongate shape, for example, a high-voltage cable, a conductive high-voltage connection or the like. No voltage drop occurs across these components in the operating condition. However, for the high-voltage electrode, use can also be made of components across which a given voltage drop occurs, for example, a high-voltage damping resistor. Therefore, the term "electrode" is to be broadly interpreted in the context of the present invention.

In a preferred embodiment of the invention, based on a high-voltage unit comprising at least a high-voltage connector for connection of a high-voltage cable of a high-voltage unit, the measuring divider/resistor arrangement is provided between the high-voltage connector and the measuring electrode. The high-voltage connector with the conductor provided therein then serves as the high-voltage electrode.

In a further embodiment of the invention there is provided an insulating member which at least partly encloses the high-voltage electrode and the measuring divider/resistor arrangement, the measuring divider/resistor arrangement being secured to the insulating member and the measuring electrode being provided on the external surface of the insulating member. The insulating member ensures simple mounting and enables suitably defined relative positioning of the electrodes and the measuring divider/resistor arrangement.

BRIEF DESCRIPTION OF THE DRAWING

The invention will be described in detail hereinafter with reference to the accompanying drawings, in which.

DESCRIPTION OF THE PREFERRED EMBODIMENTS

Figure 1:
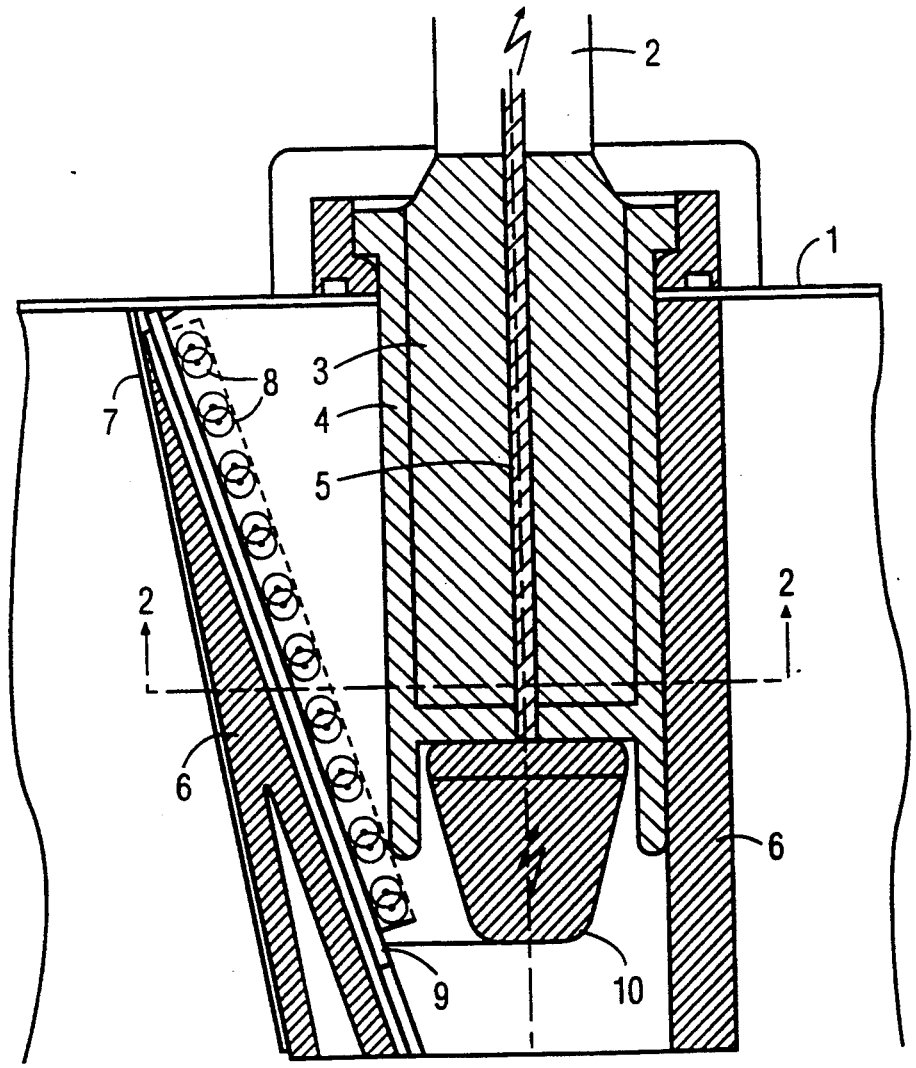
FIG. 1 is a sectional view of a part of a high-voltage generator.

FIG. 1 shows a high-voltage unit in the form of a high-voltage generator for an X-ray generator. The drawing shows only a part of the high-voltage generator, that is to say a metal, grounded wall 1 of a housing which accommodates all components of the high-voltage generator, including the liquid or gaseous insulating media. The high voltage generated is fed out via (at least) one cable 2 which is connected to the high-voltage generator via a high-voltage connector.

The high-voltage connector comprises a cylindrical high-voltage plug 3, which is connected to the cable 2, and a hollow-cylindrical high-voltage socket 4 which is rigidly connected to the wall 1 and the inner dimensions of which are adapted to the outer dimensions of the high-voltage plug 3. At the center of the high-voltage plug 3 there is provided a high-voltage lead 5 (or several leads carrying approximately the same high-voltage potential) which is connected, through the bottom of the high-voltage socket, to the other components inside the high-voltage generator (not shown). The high-voltage lead 5 is also referred to hereinafter as high-voltage electrode. An X-ray source (not shown) is connected to the high-voltage generator via the cable 2 (and possibly via a further cable carrying a high-voltage of opposite polarity). The high-voltage generator forms a part of an X-ray generator, together with a low-voltage unit powering the generator.

Figure 2:
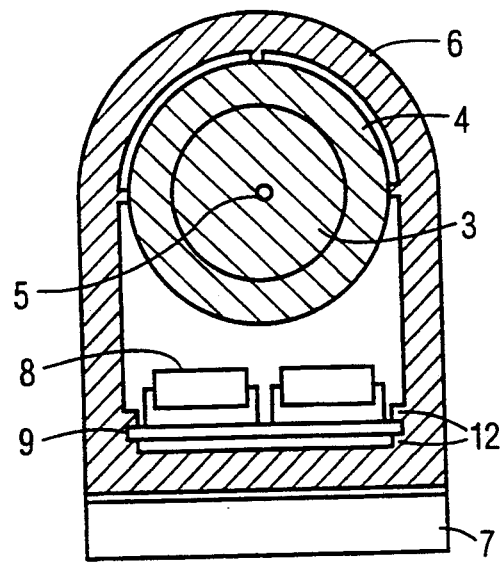
FIG. 2 is a sectional view taken along the line A—A' in FIG. 1.

As appears from FIGS. 1 and 2, the high-voltage connector is at least partly enclosed by an insulating member 6. The insulating member 6 may consist of a duro-plastic or thermo-plastic material, for example, polycarbonate. On a part of the outer wall of the insulating member 6 which is slightly inclined relative to the high-voltage connector 3,4 there is provided a measuring electrode 7 on which, in the operating condition, a potential develops whose variation in time is substantially identical to the variation in time of the high-voltage potential on the high-voltage electrode 5, but is a factor of, for example 20,000 lower than the potential of the high-voltage electrode 5. Between the housing wall 1 and the measuring electrode 7, therefore, a voltage of a few volts occurs during operation. Looking in the longitudinal direction of the high-voltage unit, it can be seen that the high-voltage electrode 5, the measuring divider/resistor 8 and the measuring electrode 7 are all substantially coextensive.

An electric field is formed between the high-voltage conductor 5 and the measuring electrode 7 in the operating condition. In this field-filled space there is arranged a measuring divider/resistor arrangement. In an embodiment for 110 kV, this arrangement consists of 2×10 electrically series-connected discrete resistors 8 of, for example, 26.7MΩ each. One end of this resistor chain is connected to the high-voltage electrode 5, the other end being connected to the measuring electrode 7. The resistors 8 are arranged in a zig-zag configuration on a printed circuit board 9 which is inclined relative to the electrodes 5 and 7 so that the end of the printed circuit board connected to the measuring electrode 7 is situated nearer to the measuring electrode than the other end and the end connected to the high-voltage electrode is situated nearer to the high-voltage electrode than the other end. The aim is to ensure that the voltage distribution along the measuring divider/resistor arrangement corresponds as close as possible to the field distribution between the high-voltage electrode 5 and the measuring electrode 7. This purpose is also served by a bell-shaped shielding electrode 10 which carries the high-voltage potential and is connected to the lead 5, said shielding electrode reducing the dielectric field strength to a defined value at the end of the high-voltage connector and at the area of the end of the measuring divider/resistor arrangement connected thereto. The printed circuit board 9 is inserted into a groove 11 in the insulating member 6, said groove being formed between two projections 12 on the insulating member 6 which extend in the longitudinal direction.

Figure 3:
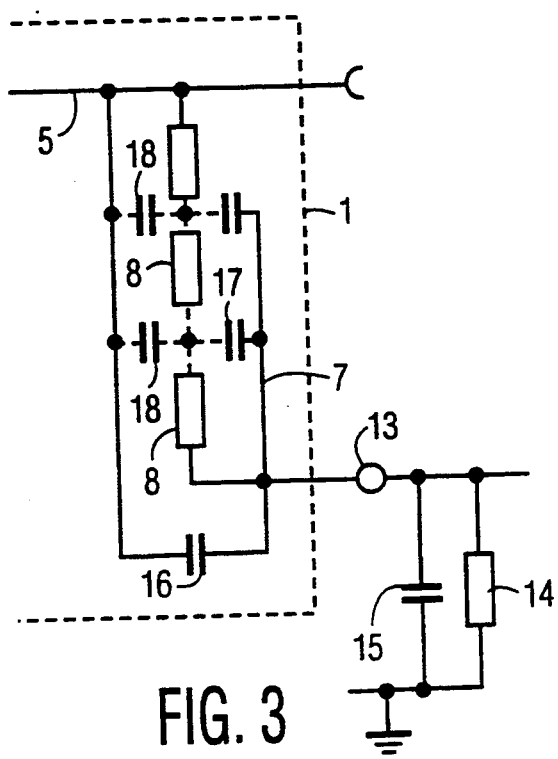
FIG. 3 shows an equivalent diagram of the high-voltage measuring divider.

FIG. 3 shows the equivalent diagram of the high-voltage measuring divider. The measuring electrode 7 is conductively connected to a measuring point 13 which is connected to ground via a terminal impedance consisting of a resistor 14 and a capacitor 15 connected parallel thereto. The resistor 14 is a factor 1000 smaller than each of the twenty resistors 8, so that a voltage divisor amounting to 1:20,000 is obtained (for direct current). When a voltage of, for example, at the most 110 kV is present on the electrode 5, therefore, a voltage of 5.5 volts will be present on the measuring point 13. The terminal impedance 14, 15 may be arranged outside the high-voltage generator and the voltage derived therefrom may be applied to an amplifier (not shown).

The capacitor 15 is proportioned so that for high frequencies, where the capacitive current is large in comparison with the current across the resistors 8, the same divisor is obtained as for the direct voltage. The capacitive current is determined essentially by the capacitance 16 occurring between the high-voltage electrode 5 and the measuring electrode 7.

Furthermore, parasitic capacitances 17 occur between the measuring divider/resistor arrangement 8 and the measuring electrode 7, and parasitic capacitances 18 occur between the measuring divider/resistor arrangement 8 and the high-voltage electrode 5. In the ideal case, i.e. when the measuring divider/resistor arrangement is arranged in the electric field between the electrodes 5 and 7 so that the electrostatic potential variation between the electrodes 5 and 7 corresponds to the potential variation imposed by the current flow through the measuring resistor arrangement 8, the currents across the capacitances 17 and 18 are opposed and are the same. Thus, the currents flowing across these capacitances do not affect the voltage distributions of the measuring divider/resistor arrangement. However, this ideal case is very difficult to achieve in practice. In order to minimize the disturbing effect of these capacitances on the frequency response, the capacitance 16 should be as high as possible. If necessary, the capacitance 16 can be increased by making the measuring electrode 7 extend across a larger part of the external surface of the insulating member 6. If necessary, the measuring electrode may cover the entire external surface.

It is an advantage that the measuring electrode 7 shields the measuring divider/resistor arrangement 8 relative to ground. Consequently, as opposed to the measuring divider in conformity with EP-OS 118 147, no parasitic capacitances occur between the resistor arrangement 8 and ground, but only between this arrangement and the measuring electrode 7. As a result, the currents across these parasitic capacitances are not drained via the housing 1 but flow across the measuring electrode 7 and hence also across the terminal impedance 14, 15. Therefore, they participate in the measurement.

A further advantage of the invention resides in the fact that a component which carries a high voltage and which is in any case required in the high-voltage generator at the same time serves as a high-voltage electrode for the measuring divider, thus reducing the costs and the building volume required. Moreover, in comparison with the voltage divider in conformity with DE-PS 37 14 945, an advantage is achieved in that the high-voltage divider is arranged inside and not outside. The clearances relative to the components which do not carry the same high voltage inside the high-voltage generator, therefore, can be reduced. Moreover, the measuring electrode reduces the electromagnetic radiation from the high-voltage electrode to other leads and components.

Instead of the high-voltage connector, another high-voltage carrying component already present in the high-voltage generator could be used. However, the high-voltage connector 3, 4 offers the advantage that the insulation of the high-voltage electrode is already present, i.e. no additional insulation needs to be provided between the measuring divider/resistor arrangement 8, notably its end connected to the measuring electrode 7, and the high-voltage electrode.

Instead of a chain of discrete resistors 8, the measuring resistor arrangement may also comprise a thick-film circuit or thin-film circuit provided on the board 9.

The wiring of the high-voltage divider at its terminal impedance, i.e. between the measuring point and ground, may deviate from that shown in FIG. 3. For example, a series RC member may be connected parallel to the RC member 14, 15. When this series RC member is suitably proportioned, the frequency independency of the voltage divisor can be further improved, if necessary.

We claim:

1. A high-voltage unit comprising: a high-voltage electrode which carries a high voltage in the operating condition of the high-voltage unit and a measuring divider/resistor arrangement which is connected between the high-voltage electrode and a measuring point from which a measuring voltage is derived corresponding to the variation in time of the high voltage, wherein a flat measuring electrode is provided which carries the potential of the measuring point, the measuring divider/resistor arrangement being physically arranged between the high-voltage electrode and the measuring electrode so as to be inclined relative to each of said electrodes.

2. A high-voltage unit as claimed in claim 1, wherein measuring divider/resistor arrangement comprises a board on which the resistor arrangement is provided, one end of the board being situated in the vicinity of the high-voltage electrode and, the other end of the board being situated in the vicinity of the measuring electrode.

3. A high-voltage unit as claimed in claim 2, wherein the measuring divider/resistor arrangement includes a number of series-connected discrete resistors arranged in a zig-zag configuration on said board.

4. A high-voltage unit as claimed in claim 2 which comprises at least one high-voltage connector for connecting a high-voltage cable to the high-voltage unit, and wherein the measuring divider/resistor arrangement is physically situated between the high-voltage connector and the measuring electrode.

5. A high-voltage unit as claimed in claim 4, wherein one end of the high-voltage connector includes a bell shaped shielding electrode which carries the high-voltage potential, the measuring divider/resistor arrangement being inclined towards the shielding electrode.

6. A high-voltage unit as claimed in claim 2 further comprising an insulating member which at least partly encloses the high-voltage electrode and the measuring divider/resistor arrangement, the measuring divider/resistor arrangement being connected to the insulating member and the measuring electrode being provided on an external surface of the insulating member.

7. A high-voltage unit as claimed in claim 1 further comprising an insulating member which at least partly encloses the high-voltage electrode and the measuring divider/resistor arrangement, the measuring divider/resistor arrangement being connected to the insulating member and the measuring electrode being provided on an external surface of the insulating member.

8. In an X-ray generator, the improvement comprising a high-voltage unit as claimed in claim 1 wherein said high-voltage electrode is a part of the X-ray generator.

9. A high-voltage unit as claimed in claim 1, wherein the measuring divider/resistor arrangement comprises at least one of a thick-film and a thin-film circuit.

10. A high-voltage unit as claimed in claim 1 which comprises at least one high-voltage connector for connecting a high-voltage cable to the high-voltage unit, and wherein the measuring divider/resistor arrangement is physically situated between the high-voltage connector and the measuring electrode.

11. A high-voltage unit as claimed in claim 10, wherein one end of the high-voltage connector includes a bell-shaped shielding electrode which carries the high-voltage potential, the measuring divider/resistor arrangement being inclined towards the shielding electrode.

12. A high-voltage unit as claimed in claim 11 further comprising an insulating member which at least partly encloses the high-voltage electrode and the measuring divider/resistor arrangement, the measuring divider/resistor arrangement being connected to the insulating member and the measuring electrode being provided on an external surface of the insulating member.

13. A high-voltage apparatus comprising:
an elongate high-voltage electrode which receives a high voltage to be measured and which extends parallel to a longitudinal axis of the high-voltage apparatus,
a measuring terminal which provides a measuring voltage corresponding to the high-voltage on said high-voltage electrode,
a measuring divider/resistor arrangement electrically connected to said high-voltage electrode, and
a flat measuring electrode electrically connected to said measuring terminal and to said measuring divider/resistor arrangement whereby the measuring divider/resistor arrangement is electrically connected between the high-voltage electrode and the measuring terminal, and wherein
the measuring divider/resistor arrangement is positioned between the high-voltage electrode and the measuring electrode so as to be inclined relative to each of said electrodes.

14. A high-voltage apparatus as claimed in claim 13 further comprising:
a bell-shaped electrode connected to one end of the high-voltage electrode and with the measuring divider/resistor arrangement inclined towards the bell-shaped electrode such that a voltage distribution along the measuring divider/resistor arrangement approximates a field distribution produced between the high-voltage electrode and the measuring electrode.

15. A high-voltage apparatus as claimed in claim 13 wherein said measuring divider/resistor arrangement comprises a series connected resistor chain having a first end connected to the high-voltage electrode and a second end connected to the measuring electrode, said resistor chain being inclined relative to said electrodes such that the second end of the resistor chain is located closer to the measuring electrode than is the first end thereof and the first end of the resistor chain is located closer to the high-voltage electrode than is the second end of the resistor chain.

16. A high-voltage apparatus as claimed in claim 13 wherein the high-voltage electrode and the measuring divider/resistor arrangement extend in the same general direction with one end of the high-voltage electrode located in the vicinity of one end of the measuring divider/resistor arrangement and the other end of the high-voltage electrode located in the vicinity of the other end of the measuring divider/resistor arrangement.

17. A high-voltage apparatus as claimed in claim 13 wherein the measuring divider/resistor arrangement extends in approximately the same direction as said measuring electrode and is coextensive therewith for at least a major part of said measuring divider/resistor arrangement.

18. A high-voltage apparatus as claimed in claim 17 wherein a substantial length of said high-voltage electrode is coextensive with said measuring divider/resistor arrangement and with said measuring electrode such that a voltage distribution along the measuring divider/resistor arrangement approximates a field distribution produced between the high-voltage electrode and the measuring electrode.

19. A high-voltage apparatus as claimed in claim 13 wherein a first end of the high-voltage electrode, a first end of the measuring divider/resistor arrangement and a first end of the measuring electrode are all located in the vicinity of one another, and wherein a second end of the measuring divider/resistor arrangement is located closer to a second end of the measuring electrode than it is to a second end of the high-voltage electrode.

20. A high-voltage apparatus as claimed in claim 13 further comprising an insulating member which at least partly encloses the high-voltage electrode and the measuring divider/resistor arrangement, and wherein the measuring electrode is located on an external surface of the insulating member.

* * * * *